United States Patent
Wada

(10) Patent No.: US 11,607,752 B2
(45) Date of Patent: Mar. 21, 2023

(54) SOLDER ALLOY, SOLDER JOINT MATERIAL, AND ELECTRONIC CIRCUIT BOARD

(71) Applicant: KOKI Company Limited, Tokyo (JP)

(72) Inventor: Takehiro Wada, Tokyo (JP)

(73) Assignee: KOKI Company Limited, Tokyo (JP)

( * ) Notice: Subject to any disclaimer, the term of this patent is extended or adjusted under 35 U.S.C. 154(b) by 109 days.

(21) Appl. No.: 16/608,917

(22) PCT Filed: Sep. 27, 2018

(86) PCT No.: PCT/JP2018/035932
§ 371 (c)(1),
(2) Date: Oct. 28, 2019

(87) PCT Pub. No.: WO2019/069788
PCT Pub. Date: Apr. 11, 2019

(65) Prior Publication Data
US 2021/0114146 A1     Apr. 22, 2021

(30) Foreign Application Priority Data

Oct. 3, 2017  (JP) .............................. JP2017-193467

(51) Int. Cl.
*B23K 35/26* (2006.01)
*C22C 13/02* (2006.01)
*B23K 101/42* (2006.01)

(52) U.S. Cl.
CPC ............ *B23K 35/262* (2013.01); *C22C 13/02* (2013.01); *B23K 2101/42* (2018.08)

(58) Field of Classification Search
None
See application file for complete search history.

(56) References Cited

U.S. PATENT DOCUMENTS

| | | | | |
|---|---|---|---|---|
| 4,670,217 A | * | 6/1987 | Henson | B23K 35/262 420/562 |
| 5,837,191 A | * | 11/1998 | Gickler | C22C 13/00 420/560 |
| 7,029,542 B2 | * | 4/2006 | Amagai | B23K 35/262 148/400 |
| 2015/0037088 A1 | | 2/2015 | Ohnishi et al. | |
| 2015/0305167 A1 | * | 10/2015 | Nakanishi | H05K 3/3457 174/257 |
| 2016/0279741 A1 | | 9/2016 | Ukyo et al. | |
| 2016/0325384 A1 | | 11/2016 | Liu et al. | |
| 2017/0197281 A1 | * | 7/2017 | Choudhury | B23K 1/0016 |
| 2018/0214989 A1 | | 8/2018 | Ikeda et al. | |
| 2019/0076966 A1 | | 3/2019 | Ohnishi et al. | |
| 2019/0210161 A1 | | 7/2019 | Arai et al. | |

FOREIGN PATENT DOCUMENTS

| | | |
|---|---|---|
| CN | 1398697 | 2/2003 |
| CN | 105592972 | 5/2016 |
| CN | 106001978 | 10/2016 |
| EP | 3 593 937 | 1/2020 |
| JP | 2014-057974 | 4/2014 |
| JP | 2016-179498 | 10/2016 |
| JP | 2017-060997 | 3/2017 |
| JP | 2017-170465 | 9/2017 |
| JP | 2017-170527 | 9/2017 |
| JP | 6230737 | 11/2017 |
| JP | 2018-058090 | 4/2018 |

* cited by examiner

*Primary Examiner* — Devang R Patel
(74) *Attorney, Agent, or Firm* — Clark & Brody LP

(57) ABSTRACT

A solder alloy is used for soldering, and its chemical composition in mass % includes: 2.0 to 4.0% of Ag; 0.6 to 1.2% of Cu; 2.0 to 5.0% of Sb; 1.1 to 3.5% of In; 0 to 0.20% of Ni; 0 to 0.20% of Co; 0 to 0.05% of Ge; and balance of Sn, and impurities.

8 Claims, No Drawings

SOLDER ALLOY, SOLDER JOINT MATERIAL, AND ELECTRONIC CIRCUIT BOARD

CROSS-REFERENCE TO RELATED APPLICATION

This application claims priority to Japanese Patent Application No. 2017-193467, the disclosure of which is incorporated herein by reference in its entirety.

FIELD

The present invention relates to solder alloy used for soldering, a solder joint material including powder of the solder alloy, and an electronic circuit board that is soldered using the solder joint material.

BACKGROUND

Conventionally, solder paste including solder alloy powder and flux is used for soldering parts to be joined such as electronic parts to a board to produce an electronic circuit board. The solder paste is applied to an electrode portion on a surface of the board, and heated at a certain temperature (reflow temperature) while the electrode portion is in contact with the electrode portions of the parts to be joined. Thereby, the solder alloy melts to form solder joint portions, and the board and the part to be joined are joined together via the solder joint portions.

As the solder alloy, known is a solder alloy (hereinafter referred to also as SAC-based alloy) including tin (hereinafter referred to also as Sn) as the main component, silver (hereinafter referred to also as Ag), and copper (hereinafter referred to also as Cu). The SAC-based alloy may include antimony (hereinafter referred to also as Sb), which can improve heat-resisting properties, joining strength, and joining reliability of the solder joint portions.

However, the SAC-based alloy has a high melting point due to the inclusion of Sb, and thus requires the reflow temperature to be set to a high temperature. When such a high reflow temperature is set, electronic parts that constitute an electronic circuit and have low heat-resisting properties may be damaged by reflow heat, and the quality of the electronic circuit board may thereby deteriorate.

Therefore, a SAC-based alloy including bismuth (hereinafter referred to also as Bi) together with Sb has been proposed (for example, Patent Literature 1). Such a SAC-based alloy including Sb and Bi has a low melting point due to the inclusion of Bi, and thus the reflow temperature can be set to a low temperature (for example, 235±5° C.) to consequently suppress deterioration in the quality of the electronic circuit board.

In recent years, a number of electronic circuit boards have been mounted, for example, near the engine of an automobile. Such electronic circuit boards are exposed to a severe temperature cycle condition (for example, a temperature cycle of −30° C. to 120° C.) due to the repeated starting and stopping of the engine. It is known that the electronic circuit board that is soldered using the aforementioned SAC-based alloy including Sb and Bi has the solder joint portions exhibiting excellent thermal fatigue resistance even under such a severe temperature cycle condition (for example, Patent Literature 2).

CITATION LIST

Patent Literature

Patent Literature 1: JP 2014.057974 A
Patent Literature 2: JP 2017-060997 A

SUMMARY

Technical Problem

Examples of a method for soldering a board and parts to be joined such as electronic parts include a through-hole soldering method in which each of the parts to be joined (for example, a lead terminal) is inserted into a through-hole formed through the board for soldering. In this method, the part to be joined that is inserted into the through-hole is connected to the board via a solder fillet formed between a land of the board and the part to be joined. When through-hole soldering is carried out using the aforementioned SAC-based alloy including Sb and Bi, a phenomenon that the solder fillet is peeled off from the land of the board (hereinafter referred to also as lift-off) occurs, which is a problem. The lift-off if occurring decreases an area in which the solder fillet is joined to the land and thereby decreases joint strength in the solder joint portion, which leads to deterioration in the quality of the electronic circuit board.

The present invention has been conceived to solve such a problem, and it is an object of the present invention to provide a solder alloy, a solder joint material, and an electronic circuit board that enable soldering at the same reflow temperature as that for the conventional SAC-based alloy (for example, a peak temperature of 240° C.), and that can form a solder joint portion having excellent durability even under a severe temperature cycle condition (for example, a temperature cycle of −30° C. to 120° C.) and capable of suppressing occurrence of lift-off.

Solution to Problem

The present inventors have found that Bi included in the SAC-based alloy causes the lift-off to occur in the solder joint portion. Further, the present inventors have found that the SAC-based alloy including a specific amount of indium (hereinafter referred to also as In) instead of Bi enables soldering at the same reflow temperature as that for the conventional SAC-based alloy (for example, a peak temperature of 240° C.) and can form a solder joint portion that has excellent durability even under a severe temperature cycle condition (for example, a temperature cycle of −30° C. to 120° C.) and that is capable of suppressing occurrence of lift-off. The summary of the present invention is provided below.

The solder alloy according to the present invention is used for soldering, and its chemical composition in mass % includes: 2.0 to 4.0% of silver (hereinafter referred to also as Ag); 0.6 to 1.2% of copper (hereinafter referred to also as Cu); 2.0 to 5.0% of antimony (hereinafter referred to also as Sb); 1.1 to 3.5% of indium (hereinafter referred to also as In); 0 to 0.20% of nickel (hereinafter referred to also as Ni); 0 to 0.20% of cobalt (hereinafter referred to also as Co); 0 to 0.05% of germanium (hereinafter referred to also as Ge); and balance of tin (hereinafter referred to also as Sn) and impurities.

The total content of Ni and Co in mass % is preferably 0.01 to 0.20%.

As the chemical composition in mass %, 0.001 to 0.05% of Ge is preferably included.

The solder alloy according to the present invention preferably satisfies formula (i) below:

$$Ag/Cu \geq 2.8 \quad \text{(i)}$$

where each element symbol in the formula denotes the content (in mass %) of the element in the solder alloy.

The solder alloy according to the present invention preferably satisfies formula (ii) below:

$$-1.5 \leq Sb-In \leq 2.0 \quad \text{(ii)}$$

where each element symbol in the formula denotes the content (in mass %) of the element in the solder alloy.

The solder alloy according to the present invention preferably satisfies formula (iii) below:

$$7.5 \leq Ag+Sb+In \leq 13.5 \quad \text{(iii)}$$

where each element symbol in the formula denotes the content (in mass %) of the element in the solder alloy.

The solder alloy according to the present invention preferably has a melting temperature range of 20° C. or less.

The solder joint material according to the present invention includes the solder alloy and flux.

The electronic circuit board according to the present invention is formed by being joined using the solder joint material.

DESCRIPTION OF EMBODIMENTS

Hereinafter, the solder alloy, the solder joint material, and the electronic circuit board according to an embodiment of the present invention will be described.

<Solder alloy>

The solder alloy according to this embodiment is used for soldering and its chemical composition in mass % includes: 2.0 to 4.0% of Ag; 0.6 to 1.2% of Cu; 2.0 to 5.0% of Sb; 1.1 to 3.5% of In; 0 to 0.20% of Ni; 0 to 0.20% of Co; 0 to 0.05% of Ge; and balance of Sn and impurities. Examples of the form of the solder alloy include solder bar, solder wire, solder power, solder foil, and formed solder.

Ag is an essential component of the solder alloy, the content thereof being 2.0 to 4.0 mass %. When the content of Ag falls within the aforementioned range, a solder joint portion having excellent durability even under a severe temperature cycle condition (for example, a temperature cycle of −30° C. to 120° C.) and capable of suppressing occurrence of lift-off can be formed. The content of Ag is preferably 2.5 mass % or more, more preferably 3.0 mass % or more. The content of Ag is preferably 3.8 mass % or less, more preferably 3.4 mass % or less.

Cu is an essential component of the solder alloy, the content thereof being 0.6 to 1.2 mass %. When the content of Cu falls within the aforementioned range, a solder joint portion having excellent durability even under a severe temperature cycle condition (for example, a temperature cycle of −30° C. to 120° C.) and capable of suppressing occurrence of lift-off can be formed. The content of Cu is preferably 0.7 mass % or more. The content of Cu is preferably 0.9 mass % or less, more preferably 0.8 mass % or less.

The solder alloy preferably satisfies formula (i) below. The elements Ag and Cu are both included to reduce the melting point of the solder alloy. Further, Ag is an element that better improves the wet-spreading properties of solder than Cu. Thus, the solder alloy can improve the wet-spreading properties of solder when the ratio of Ag to Cu satisfies formula (i) below:

$$Ag/Cu \geq 2.8 \quad \text{(i)}$$

where each element symbol in the formula denotes the content (in mass %) of the element in the alloy.

Sb is an essential component of the solder alloy, the content thereof being 2.0 to 5.0 mass %. When the content of Sb falls within the aforementioned range, a solder joint portion having excellent durability even under a severe temperature cycle condition (for example, a temperature cycle of −30° C. to 120° C.) and capable of suppressing occurrence of lift-off can be formed. The content of Sb is preferably 2.2 mass % or more, more preferably 2.5 mass % or more. The content of Sb is preferably 4.5 mass % or less, more preferably 4.0 mass % or less.

In is an essential component of the solder alloy. In is an element that is dissolved in Sn to improve joint strength of a solder joint portion without deteriorating its ductility. The element In reduces the melting point of the solder alloy. In the solder alloy, the content of In is 1.1 to 3.5 mass %. When the content of In is 1.1 mass % or more, soldering can be carried out at the same reflow temperature as that for the conventional SAC-based alloy (for example, a peak temperature of 240° C.) and a solder joint portion having excellent durability even under a severe temperature cycle condition (for example, a temperature cycle of −30° C. to 120° C.) can be formed. When the content of In is 3.5 mass % or less, a solder joint portion capable of suppressing occurrence of lift-off can be formed. The content of In is preferably 1.3 mass ° A) or more, more preferably 1.5 mass % or more. The content of In is preferably 3.2 mass % or less, more preferably 3.0 mass weight % or less.

The solder alloy preferably satisfies formula (ii) below. Sb and In are both elements that are dissolved in Sn to increase strength, but the element Sb if excessively included may raise the melting point of the solder alloy and deteriorate the wet-spreading properties of solder. The element In if excessively included may reduce the melting point of the solder alloy but deteriorate the wet-spreading properties of solder. Thus, solder can be sufficiently molten at a low reflow temperature and the wet-spreading properties of solder can be improved when the difference between Sb and In satisfies formula (ii) below:

$$-1.5 \leq Sb-In \leq 2.0 \quad \text{(ii)}$$

where each element symbol in the formula denotes the content (in mass %) of the element in the alloy.

The solder alloy preferably satisfies formula (iii) below. Sn, Cu, Sb, and In are elements that are included to increase strength and adjust the melting point, but these elements if excessively included may widen the melting temperature range of the solder alloy, and segregation that causes lift-off may occur. Thus, occurrence of lift-off can be more suppressed to improve joining reliability when the total content of these elements satisfies formula (iii) below:

$$7.5 \leq Ag+Cu+Sb+In \leq 13.5 \quad \text{(iii)}$$

where each element symbol in the formula denotes the content (in mass %) of the element in the alloy.

In the solder alloy, Ni is a component that is included as needed, the content thereof being 0.20 mass % or less. When the content of Ni falls within the aforementioned range, a compound including Ni, Sn, and Cu can be precipitated in the state of being finely dispersed in the Sn parent phase. As a result, the heat-resisting properties and the strength of the solder joint portion can be improved. When the content of Ni exceeds 0.20 mass %, the precipitated compound is coarsened to thereby cause stress concentration of thermal stress that is generated during temperature cycling. As a result, a crack may occur that starts from a portion where the stress concentration is caused. The content of Ni is preferably 0.01 mass % or more, more preferably 0.03 mass % or more, particularly preferably 0.07 mass % or more. The content of Ni is preferably 0.15 mass % or less.

In the solder alloy, Co is a component that is included as needed, the content thereof being 0.20 mass % or less. When the content of Co falls within the aforementioned range, a compound including Co, Sn, and Cu can be precipitated in the state of being finely dispersed in the Sn parent phase. As a result, the heat-resisting properties and the strength of the solder joint portion can be improved. When the content of Co exceeds 0.20 mass %, the precipitated compound is coarsened to thereby cause stress concentration of thermal stress that is generated during temperature cycling. As a result, a crack may occur that starts from a portion where the stress concentration is caused. The content of Co is preferably 0.01 mass % or more, more preferably 0.03 mass % or more. The content of Co is preferably 0.15 mass % or less.

In the solder alloy, the total content of Ni and Co in mass % is preferably 0.01 to 0.20%. When the total content of Ni and Co falls within the aforementioned range, a compound including Ni, Co, Sn, and Cu can be precipitated in the state of being finely dispersed in the Sn parent phase. As a result, the heat-resisting properties and the strength of the solder joint portion can be improved. When the content of Ni and Co exceeds 0.20 mass %, the precipitated compound is coarsened to thereby cause stress concentration of thermal stress that is generated during temperature cycling. As a result, a crack may occur that starts from a portion where the stress concentration is caused. The total content of Ni and Co is preferably 0.03 mass % or more, more preferably 0.15 mass % or less. If the solder alloy includes any one of Ni and Co, the total content means the content of the one of Ni and Co.

In the solder alloy, Ge is a component that is included as needed, the content thereof being 0.05 mass % or less. When the content of Ge falls within the aforementioned range, oxidization of the solder alloy can be suppressed. This can reduce the amount of oxide on the surface of molten solder alloy, and thereby improve the wet-spreading properties of the solder.

When the content of Ge exceeds 0.05 mass %, Ge is preferentially oxidized on the surface of the molten solder alloy to reduce the wet-spreading properties of the solder. The content of Ge is preferably 0.001 mass % or more, more preferably 0.01 mass % or more. The content of Ge is preferably 0.03 mass % or less.

In the solder alloy, the balance is Sn and impurities. The impurities herein refer to components that are unavoidably incorporated in the manufacturing process and that are permitted to the extent not affecting the advantageous effects of the present invention.

The melting temperature range of the solder alloy is preferably 20° C. or less, more preferably 15° C. or less. Lift-off occurs when a slight amount of Bi or a large amount of In included in the solder alloy is segregated during the solidification process of the solder. The segregation progresses from the start of solidification of the solder to the completion of the solidification. Thus, occurrence of the lift-off can be suppressed by setting the melting temperature range to 20° C. or less. The melting temperature range herein refers to a difference between the initial melting temperature of the solder and the extrapolated terminal melting temperature thereof, which can be calculated using a differential scanning calorimetry (DSC) curve obtained at a heating speed of 5° C./min.

The solder alloy according to this embodiment enables soldering at the same reflow temperature as that for the conventional SAC-based alloy (for example, a peak temperature of 240° C.), and can form a solder joint portion having excellent durability even under a severe temperature cycle condition (for example, a temperature cycle of −30° C. to 120° C.) and capable of suppressing occurrence of lift-off.

<Solder joint material>

The solder joint material according to this embodiment includes the aforementioned solder alloy and flux. The solder joint material is a material for ease of soldering, which is produced by mixing flux or the like with the solder alloy. The solder joint material may be solder paste including flux and powder of the aforementioned solder alloy, or resin flux cored solder in which the core of wire made of the aforementioned solder alloy is filled with flux.

The flux is not particularly limited and can be a known flux (for example, rosin based, synthetic resin based).

In the case where the solder joint material is the solder paste, the content of the powder of the solder alloy in the solder paste is not particularly limited and can be, for example, 80 to 92 mass %. The content of the flux in the solder paste is not particularly limited and can be, for example, 8 to 20 mass %.

In the case where the solder joint material is the resin flux cored solder, the content of the solder alloy in the resin flux cored solder is not particularly limited and can be, for example, 95 to 99.5 mass %. The content of the flux in the resin flux cored solder is not particularly limited and can be, for example, 0.5 to 5 mass %.

The solder joint material according to this embodiment enables soldering at the same reflow temperature as that for the conventional SAC-based alloy (for example, a peak temperature of 240° C.), and can form a solder joint portion having excellent durability even under a severe temperature cycle condition (for example, a temperature cycle of −30° C. to 120° C.) and capable of suppressing occurrence of lift-off. In the case where the solder joint material is the resin flux cored solder, the temperature of the iron tip can be lowered to thereby suppress thermal damage of electronic parts.

<Electronic circuit board>

The electronic circuit board according to this embodiment is soldered using the solder joint material according to this embodiment.

The electronic circuit board is produced by soldering a board and parts to be joined such as electronic parts using the solder joint material according to this embodiment. The electronic parts are not particularly limited, and can be known electronic parts such as chip parts (e.g. an IC chip), a resistor, a diode, a capacitor, and a transistor.

The electronic circuit board according to this embodiment enables soldering at the same reflow temperature as that for the conventional SAC-based alloy (for example, a peak temperature of 240° C.), and can therefore suppress deterioration of the quality. The electronic circuit board according to this embodiment can also have a solder joint portion having excellent durability even under a severe temperature cycle condition (for example, a temperature cycle of −30° C. to 120° C.) and capable of suppressing occurrence of lift-off.

EXAMPLES

Examples of the present invention will be hereinafter described. However, the present invention is not limited to the following examples.

<Calculation of Melting Temperature Range>

The melting temperature range was calculated by determining a difference between the initial melting temperature of solder and the extrapolated terminal melting temperature thereof, using a differential scanning calorimetry (DSC) curve obtained at a heating speed of 5° C./min. The initial melting temperature was calculated according to the method for obtaining a solder solidus temperature specified in XS Z 3198-1, using the aforementioned DSC curve. The extrapolated terminal melting temperature was calculated according to the method for determining the extrapolated melting completion temperature specified in JIS Z 3198-1, using the aforementioned DSC curve. In the DSC, approximately 10 mg of each of ingot pieces of the solder alloys having the chemical compositions shown in Table 1 and Table 2 was put in one aluminum container holder, and then the aluminum container holder was tightly closed by placing a cover thereon. Another aluminum container holder containing nothing was tightly closed by placing a cover thereon. The measurement conditions were that the measurement temperature range was from room temperature to 300° C. and the flow rate of nitrogen (inert gas) was 40 ml/min. The calculated melting temperature ranges are shown in Tables 1 and 2.

<Production of solder foil>

Ingots of the solder alloys having the chemical compositions shown in Table 1 and Table 2 were produced and rolled to foils having a specific thickness by a rolling mill to produce solder foils of Examples 1 to 20 and Comparative Examples 1 to 19.

<Durability evaluation after cooling/heating cycle>

On a glass epoxy board (FR-4, Cu-OSP) having a thickness of 1.6 mm, the solder foils (3.2 mm long×1.6 mm wide×80 μm thick; hereinafter referred to as solder preforms) respectively of Examples 1 to 20 and Comparative Examples 1 to 19 to which flux was applied, and four chip resistors (6.3 mm wide×3.0 mm deep×0.5 mm high) were mounted according to a reflow method to produce the test boards of Examples 1 to 20 and Comparative Examples 1 to 19. The reflow soldering was carried out at a peak temperature of 240° C. for a peak retention time of 20 seconds under an atmosphere in which the oxygen concentration was controlled at 1000 ppm by flowing nitrogen. Subsequently, each test board was put into a heat cycle tester (TSA-73EL manufactured by ESPEC CORP.) and subjected to 2000 cycles of cooling and heating, each cycle consisting of 20 minutes of cooling at −30° C. and 20 minutes of heating at 120° C. Thereafter, each test board taken out of the heat cycle tester was cut at central portions of the chip parts in a direction perpendicular to the top surface of the test board, followed by mechanical precision polishing. Then, solder compositions on the cross sections were observed at 350-fold magnification using an optical microscope (KH-8700 manufactured by HIROX CO.). The total length of cracks developing in the solder compositions joined to the chips on each board was measured and the average value in the total four chips was calculated to thereafter carry out durability evaluation based on the criteria below. The results are shown in Tables 1 and 2. The test boards falling under A to C of the criteria below were judged to have good durability while the test boards falling under D and E were judged to have poor durability.

A: The average value of the total crack length is less than 100 μm.

B: The average value of the total crack length is 100 μm or more and less than 150 μm.

C: The average value of the total crack length is 150 μm or more and less than 200 μm.

D: The average value of the total crack length is 200 μm or more and less than 300 μm.

E: The average value of the total crack length is 300 μm or more, or a crack crossing the solder composition (i.e., penetrating crack) occurs.

<Evaluation of lift-off>

L-shaped header pins (the number of pins: 20, pin diameter: 0.64 mm, pitch: 2.54 mm) and the solder preforms (7 mm wide×56 mm long×100 μm thick) respectively of Examples 1 to 20 and Comparative Examples 1 to 19 to which flux was applied were inserted into through-holes formed through a glass epoxy board (FR-4, Cu-OSP) for through-hole soldering according to a reflow method to produce the test boards of Examples 1 to 20 and Comparative Examples 1 to 19. The reflow soldering was carried out at a peak temperature of 240° C. for a retention time of 20 seconds. Thereafter, the appearance of each test board was observed to see whether lift-off occurs between solder fillets and the lands of the test board, using an optical microscope of 150-fold magnification (KH-8700 manufactured by HIROX CO.). The results are shown in Tables 1 and 2.

<Evaluation of solderability>

Solderability was evaluated using the test boards of Examples 1 to 20 and Comparative Examples 1 to 19 that were used for durability evaluation after the cooling and heating cycles. An area ratio of solder wetting and spreading on the top surface of an electrode portion of each of the chip resistors on each of the test boards, the top surface being parallel to the test board, was calculated to evaluate solderability. A test board in which the average value of the area ratios of solder wetting and spreading on the total four chips was 80% or more was judged to be good while a test board in which the average value of the area ratios was less than 80% was judged to be poor. The results are shown in Table 1 and Table 2.

TABLE 1

| Classification | Composition/mass % | | | | | | | | | Ag/Cu | Ag + Cu + Sb + In | Melting temperature range (° C.) | Crack development in cooling/heating cycle | Lift-off | Solderability |
|---|---|---|---|---|---|---|---|---|---|---|---|---|---|---|---|
| | Sn | Ag | Cu | Sb | Bi | In | Ni | Co | Ge | Sb—In | | | | | |
| Ex. 1 | Bal. | 3.4 | 0.7 | 3.0 | — | 3.0 | 0.07 | — | 0.01 | 0.0 | 4.9 | 10.1 | 13 | A | None | Good |
| Ex. 2 | Bal. | 3.4 | 0.7 | 4.0 | — | 2.0 | 0.07 | — | 0.01 | 2.0 | 4.9 | 10.1 | 10 | B | None | Goad |
| Ex. 3 | Bal. | 3.4 | 0.7 | 4.0 | — | 3.0 | 0.07 | — | 0.01 | 1.0 | 4.9 | 11.1 | 14 | C | None | Good |
| Ex. 4 | Bal. | 3.4 | 0.7 | 3.0 | — | 3.2 | 0.07 | — | 0.01 | −0.2 | 4.9 | 10.3 | 11 | C | None | Good |
| Ex. 5 | Bal. | 3.4 | 0.7 | 3.0 | — | 3.5 | 0.07 | — | 0.01 | −0.5 | 4.9 | 10.6 | 11 | B | None | Good |
| Ex. 6 | Bal. | 3.4 | 0.7 | 2.5 | — | 1.1 | 0.07 | — | 0.01 | 1.4 | 4.9 | 7.7 | 9 | C | None | Good |

TABLE 1-continued

| Classi-fication | Composition/mass % | | | | | | | | | Sb—In | Ag/Cu | Ag + Cu + Sb + In | Melting temperature range (° C.) | Crack development in cooling/heating cycle | Lift-off | Solderability |
|---|---|---|---|---|---|---|---|---|---|---|---|---|---|---|---|---|
| | Sn | Ag | Cu | Sb | Bi | In | Ni | Co | Ge | | | | | | | |
| Ex. 7 | Bal. | 3.4 | 0.7 | 3.2 | — | 2.9 | 0.07 | — | 0.01 | 0.3 | 4.9 | 10.2 | 14 | B | None | Good |
| Ex. 8 | Bal. | 2.0 | 0.6 | 2.0 | — | 3.0 | 0.20 | — | — | −1.0 | 3.3 | 7.6 | 17 | C | None | Good |
| Ex. 9 | Bal. | 3.4 | 0.7 | 3.0 | — | 1.5 | 0.01 | — | 0.00 | 1.5 | 4.9 | 8.6 | 12 | B | None | Good |
| Ex. 10 | Bal. | 4.0 | 1.0 | 2.0 | — | 3.2 | — | — | 0.05 | −1.2 | 4.0 | 10.2 | 12 | C | None | Good |
| Ex. 11 | Bal. | 3.4 | 0.7 | 5.0 | — | 3.5 | — | — | 0.01 | 1.5 | 4.9 | 12.6 | 15 | A | None | Good |
| Ex. 12 | Bal. | 3.4 | 0.7 | 3.0 | — | 3.2 | — | 0.01 | 0.01 | −0.2 | 4.9 | 10.3 | 14 | B | None | Good |
| Ex. 13 | Bal. | 3.4 | 0.7 | 3.0 | — | 3.2 | — | 0.20 | 0.01 | −0.2 | 4.9 | 10.3 | 14 | B | None | Good |
| Ex. 14 | Bal. | 3.4 | 0.7 | 3.5 | — | 2.9 | 0.07 | — | 0.01 | 0.6 | 4.9 | 10.5 | 11 | A | None | Good |
| Ex. 15 | Bal. | 3.4 | 0.7 | 3.5 | — | 2.9 | — | 0.02 | 0.01 | 0.6 | 4.9 | 10.5 | 11 | A | None | Good |
| Ex. 16 | Bal. | 3.4 | 1.2 | 5.0 | — | 3.5 | — | 0.03 | 0.01 | 1.5 | 2.8 | 13.1 | 13 | A | None | Good |
| Ex. 17 | Bal. | 3.4 | 1.2 | 5.0 | — | 3.5 | 0.03 | 0.03 | 0.01 | 1.5 | 2.8 | 13.1 | 13 | B | None | Good |
| Ex. 18 | Bal. | 3.4 | 0.7 | 3.5 | — | 2.9 | 0.02 | 0.01 | 0.01 | 0.6 | 4.9 | 10.5 | 11 | A | None | Good |
| Ex. 19 | Bal. | 3.4 | 0.7 | 2.5 | — | 1.1 | — | 0.02 | 0.01 | 1.4 | 4.9 | 7.7 | 14 | C | None | Good |
| Ex. 20 | Bal. | 3.4 | 0.7 | 2.3 | — | 1.1 | 0.02 | — | 0.01 | 1.2 | 4.9 | 7.5 | 14 | C | None | Good |

TABLE 2

| Classi-fication | Composition/mass % | | | | | | | | | Sb—In | Ag/Cu | Ag + Cu + Sb + In | Melting temperature range (° C.) | Crack development in cooling/heating cycle | Lift-off | Solderability |
|---|---|---|---|---|---|---|---|---|---|---|---|---|---|---|---|---|
| | Sn | Ag | Cu | Sb | Bi | In | Ni | Co | Ge | | | | | | | |
| C. Ex. 1 | Bal. | 3.0 | 0.5 | — | — | — | — | — | — | 0.0 | 6.0 | 3.5 | 5 | E | None | Good |
| C. Ex. 2 | Bal. | 3.4 | 0.7 | 3.0 | 3.0 | — | 0.04 | — | 0.01 | 3.0 | 4.9 | 1.1 | 16 | B | Present | Good |
| C. Ex. 3 | Bal. | 3.9 | 0.7 | 1.4 | 3.0 | — | 0.15 | — | 0.01 | 1.4 | 5.6 | 6.0 | 15 | C | Present | Good |
| C. Ex. 4 | Bal. | 3.5 | 0.8 | 1.0 | 0.5 | 6.0 | — | — | — | −5.0 | 4.4 | 11.3 | 13 | B | Present | Good |
| C. Ex. 5 | Bal. | 3.5 | 0.8 | 1.0 | 0.5 | 6.0 | 0.07 | — | — | −5.0 | 4.4 | 11.3 | 13 | B | Present | Good |
| C. Ex. 6 | Bal. | 3.5 | 0.8 | 1.0 | — | 6.0 | 0.07 | — | — | −5.0 | 4.4 | 11.3 | 13 | D | Present | Good |
| C. Ex. 7 | Bal. | 3.4 | 0.7 | 3.0 | 2.0 | 1.0 | 0.07 | — | 0.01 | 2.0 | 4.9 | 8.1 | 13 | B | Present | Good |
| C. Ex. 8 | Bal. | 3.4 | 0.7 | 3.0 | 1.0 | 2.0 | 0.07 | — | 0.01 | 1.0 | 4.9 | 9.1 | 18 | D | Present | Good |
| C. Ex. 9 | Bal. | 3.4 | 0.7 | 4.0 | 2.0 | 1.0 | 0.07 | — | 0.01 | 3.0 | 4.9 | 9.1 | 14 | C | Present | Good |
| C. Ex. 10 | Bal. | 3.4 | 0.7 | 4.0 | 2.0 | 2.0 | 0.07 | — | 0.01 | 2.0 | 4.9 | 10.1 | 16 | C | Present | Good |
| C. Ex. 11 | Bal. | 3.4 | 0.7 | 4.0 | 1.0 | 2.0 | 0.07 | — | 0.01 | 2.0 | 4.9 | 10.1 | 14 | C | Present | Good |
| C. Ex. 12 | Bal. | 3.4 | 0.7 | 4.0 | 1.5 | 2.5 | 0.07 | — | 0.01 | 1.5 | 4.9 | 10.6 | 15 | D | Present | Good |
| C. Ex. 13 | Bal. | 3.4 | 0.7 | 4.0 | 2.5 | 1.5 | 0.07 | — | 0.01 | 2.5 | 4.9 | 9.6 | 17 | D | Present | Good |
| C. Ex. 14 | Bal. | 3.4 | 0.7 | 2.0 | — | 4.0 | 0.07 | — | 0.01 | −2.0 | 4.9 | 10.1 | 16 | C | Present | Good |
| C. Ex. 15 | Bal. | 3.4 | 0.7 | 3.0 | — | 3.8 | 0.07 | — | 0.01 | −0.8 | 4.9 | 10.9 | 15 | C | Present | Good |
| C. Ex. 16 | Bal. | 3.4 | 0.7 | 5.0 | — | 0.5 | 0.07 | — | 0.01 | 4.5 | 4.9 | 9.6 | 9 | C | None | Poor |
| C. Ex. 17 | Bal. | 2.5 | 0.6 | 2.0 | — | 4.0 | — | — | — | −2.0 | 4.2 | 9.1 | 18 | C | Present | Good |
| C. Ex. 18 | Bal. | 3.4 | 0.7 | 3.5 | — | 3.8 | — | 0.03 | 0.01 | −0.3 | 4.9 | 11.4 | 11 | B | Present | Good |
| C. Ex. 19 | Bal. | 3.4 | 1.1 | 3.5 | — | 3.8 | — | 0.02 | 0.01 | −0.3 | 3.1 | 11.8 | 14 | B | Present | Good |

As shown in Tables 1 and 2, the solder alloys of Examples 1 to 20 satisfying all the requirements of the present invention had good solderability at the same reflow temperature as that for the conventional SAC-based alloy (a peak temperature of 240° C.), and could form a solder joint portion having excellent durability even under a severe temperature cycle condition (a temperature cycle of −30° C. to 120° C.) and capable of suppressing occurrence of lift-off.

The solder alloy of Comparative Example 1, which does not include Sb, resulted in the significant development of cracks in the solder joint portion under a severe temperature cycle condition (a temperature cycle of −30° C. to 120° C.). The solder alloys of Comparative Examples 2 to 5 and 7 to 13, which include Bi, resulted in occurrence of lift-off in the solder joint portion. The solder alloys of Comparative Examples 4 to 6, 14, 15, and 17 to 19, which have the content of In exceeding 3.5 mass %, resulted in occurrence of lift-off in the solder joint portion. The solder alloy of Comparative Example 16, which has the content of In falling below 1.1 mass %, resulted in poor solderability at the same reflow temperature (240° C.) as that for the conventional SAC-based alloy.

The invention claimed is:

1. A solder alloy used for soldering, wherein
a chemical composition of the solder alloy in mass % comprises: 2.0 to 4.0% of Ag; 0.6 to 1.2% of Cu; 2.0 to 5.0% of Sb; 1.1 to 3.5% of In; 0.01 to 0.20% of Ni; 0.01 to 0.20% of Co; 0.001 to 0.05% of Ge; and balance of Sn and impurities, and
wherein a melting temperature range of the solder alloy is 13° C. or more and 20° C. or less.

2. The solder alloy according to claim 1, wherein the total content of Ni and Co in mass % is 0.01 to 0.20%.

3. The solder alloy according to claim 1, wherein, as the chemical composition in mass %, 0.001 to 0.05% of Ge is included.

4. The solder alloy according to claim 1, satisfying formula (i) below:

$$Ag/Cu \geq 2.8 \qquad (i)$$

where each element symbol in the formula denotes the content (in mass %) of the element in the solder alloy.

5. The solder alloy according to claim 1, satisfying formula (ii) below:

$$-1.5 \leq Sb - In \leq 2.0 \qquad (ii)$$

where each element symbol in the formula denotes the content (in mass %) of the element in the solder alloy.

6. The solder alloy according to claim 1, satisfying formula (iii) below:

$$7.5 \leq Ag + Sb + In \leq 13.5 \qquad (iii)$$

where each element symbol in the formula denotes the content (in mass %) of the element in the solder alloy.

7. A solder joint material comprising the solder alloy according to claim 1 and flux.

8. An electronic circuit board formed by being joined using the solder joint material according to claim 7.

* * * * *